US006295031B1

(12) United States Patent
Wallace et al.

(10) Patent No.: US 6,295,031 B1
(45) Date of Patent: Sep. 25, 2001

(54) MEMORY CARD ASSEMBLY HAVING AN INTEGRAL ANTENNA

(75) Inventors: Patrick Wallace, San Jose; Raymond Martino, Jr., Saratoga; Errol Dudas, San Jose; Thomas J. Hutton, Cupertino; Norman H. Nelson, Sunnyvale, all of CA (US)

(73) Assignee: Symbol Technologies, Inc., Holtsville, NY (US)

( * ) Notice: Subject to any disclaimer, the term of this patent is extended or adjusted under 35 U.S.C. 154(b) by 0 days.

(21) Appl. No.: 09/267,324

(22) Filed: Mar. 12, 1999

Related U.S. Application Data

(63) Continuation-in-part of application No. 08/855,563, filed on May 13, 1997, now Pat. No. 5,946,194, which is a continuation of application No. 08/574,931, filed on Dec. 19, 1995, now abandoned, which is a continuation of application No. 08/173,249, filed on Dec. 23, 1993, now Pat. No. 5,519,577.

(51) Int. Cl.$^7$ .................................................. H01Q 1/24
(52) U.S. Cl. ...................... 343/702; 343/841; 343/906; 235/488; 361/737
(58) Field of Search ................................. 343/702, 841, 343/906, 881, 721; 361/737, 816, 818; 235/488, 492

(56) References Cited

U.S. PATENT DOCUMENTS

| 4,039,894 | * | 8/1977 | Gardner, III | 343/721 |
|---|---|---|---|---|
| 4,658,334 | | 4/1987 | McSparran et al. | 361/415 |
| 4,661,888 | | 4/1987 | Jewell et al. | 361/424 |
| 5,055,968 | | 10/1991 | Nishi et al. | 361/395 |
| 5,107,404 | | 4/1992 | Tam | 361/424 |
| 5,124,889 | | 6/1992 | Humbert et al. | 361/424 |
| 5,198,824 | | 3/1993 | Poradish | 343/700 |
| 5,333,100 | | 7/1994 | Anhalt et al. | 361/818 |
| 5,357,091 | | 10/1994 | Ozawa et al. | 235/380 |
| 5,361,061 | * | 11/1994 | Mays et al. | 343/702 |
| 5,373,149 | | 12/1994 | Rasmussen | 235/492 |
| 5,484,997 | | 1/1996 | Haynes | 235/492 |
| 5,519,577 | | 5/1996 | Dudas et al. | 361/737 |
| 5,536,905 | | 7/1996 | Redman et al. | 174/35 |
| 5,541,448 | | 7/1996 | Carpenter | 257/679 |
| 5,563,772 | | 10/1996 | Nichols | 361/752 |
| 5,568,364 | | 10/1996 | Madden | 361/752 |
| 5,583,521 | | 12/1996 | Williams | 343/702 |
| 5,590,346 | | 12/1996 | West et al. | 395/800 |
| 5,606,732 | | 2/1997 | Vigone | 455/269 |
| 5,627,550 | | 5/1997 | Sanad | 343/700 |
| 5,657,028 | | 8/1997 | Sanad | 343/700 |
| 5,663,901 | | 9/1997 | Wallace et al. | 365/52 |
| 5,682,299 | | 10/1997 | Kunert | 361/816 |
| 5,687,064 | | 11/1997 | Nichols | 361/752 |
| 5,739,791 | * | 4/1998 | Barefield et al. | 343/702 |
| 5,764,492 | * | 6/1998 | Ady et al. | 361/818 |
| 5,946,194 | * | 8/1999 | Dudas et al. | 361/737 |

FOREIGN PATENT DOCUMENTS

| WO 92/16094 | 9/1992 | (EP) . |
|---|---|---|
| 1-98299 | 4/1989 | (JP) . |
| 92-167569/21 | 7/1990 | (JP) . |
| 4-115591 | 4/1992 | (JP) . |
| 4-116900 | 4/1992 | (JP) . |
| 5-121889 | 5/1993 | (JP) . |
| 5-191073 | 7/1993 | (JP) . |

* cited by examiner

Primary Examiner—Tan Ho

(57) ABSTRACT

This invention is directed to a memory card assembly having a first end connected to a host device and a second end connected to a retractable antenna assembly. The memory card assembly includes a radio for two way communications between the host device and a remote location. The antenna assembly comprises a housing for two antennas and two light emitting diodes (LEDs) that indicate the status of the radio. The two antennas and the two LEDs are connected to the memory card circuit board through two dual function connectors that concurrently pass analog and digital signals.

24 Claims, 12 Drawing Sheets

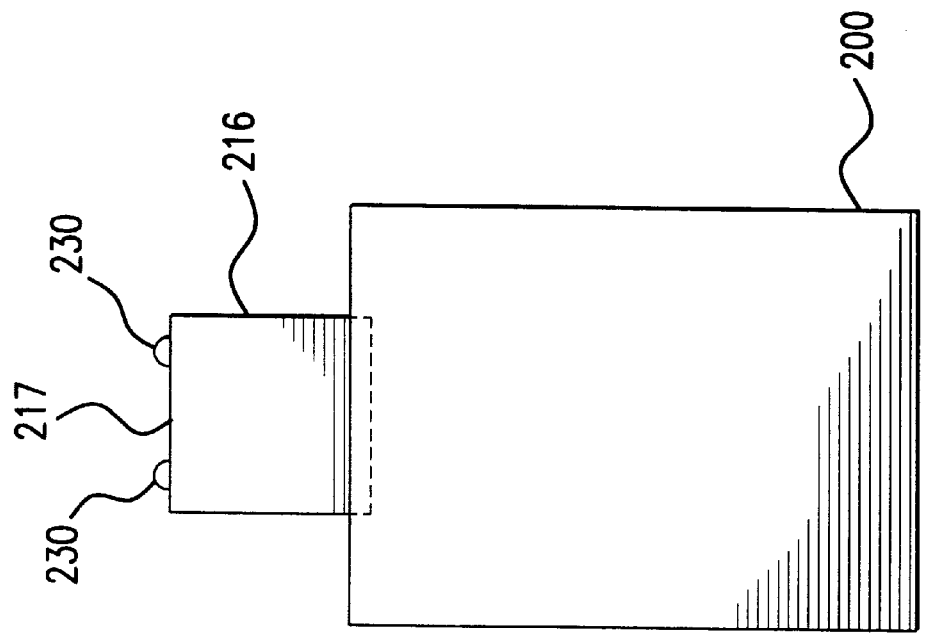
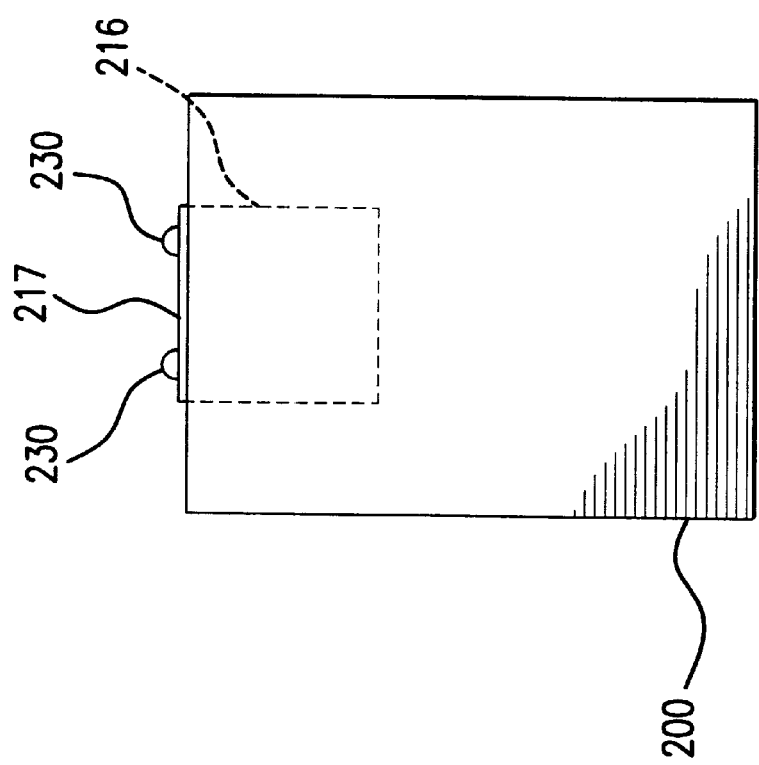
FIG. 10a
FIG. 10b

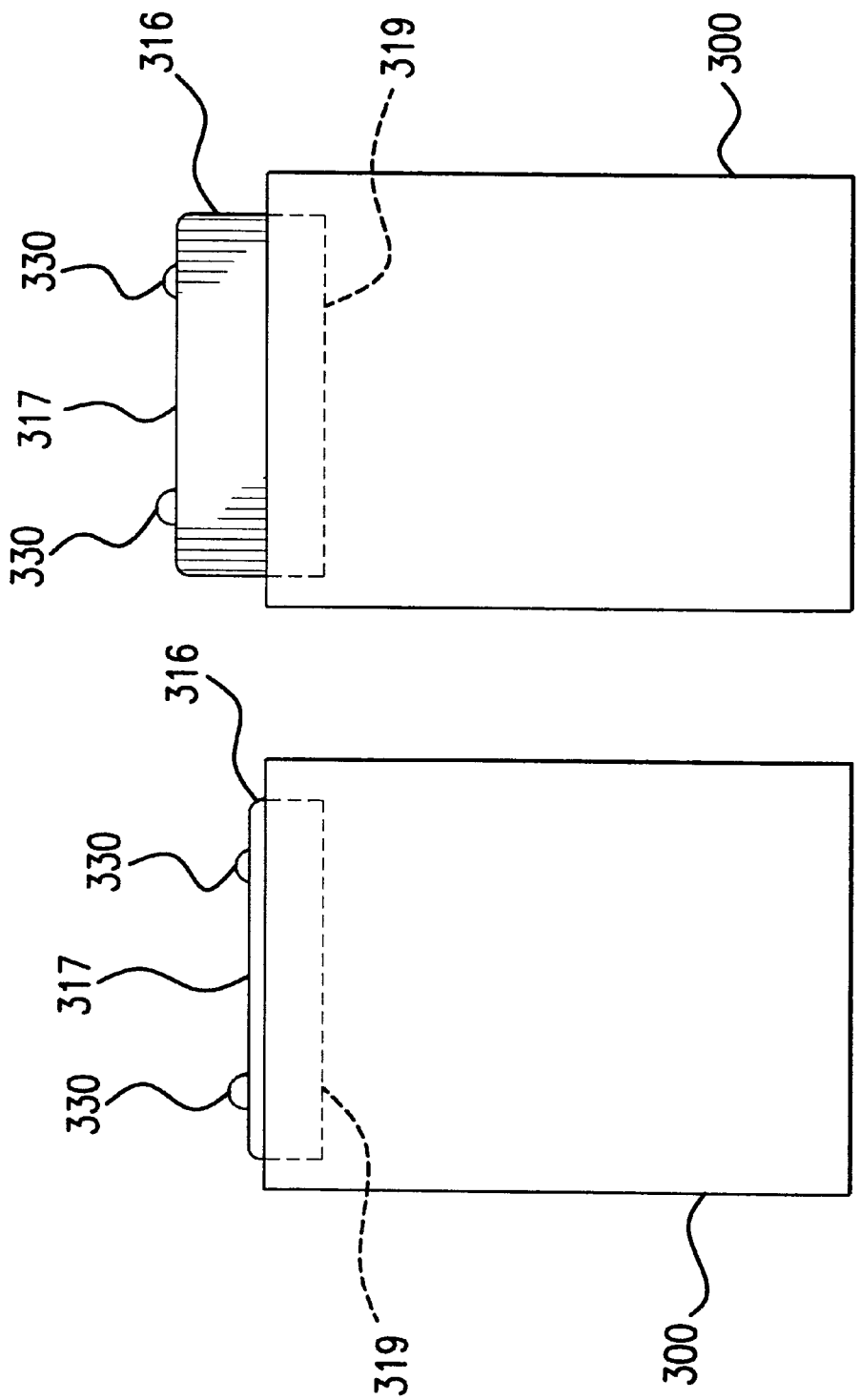

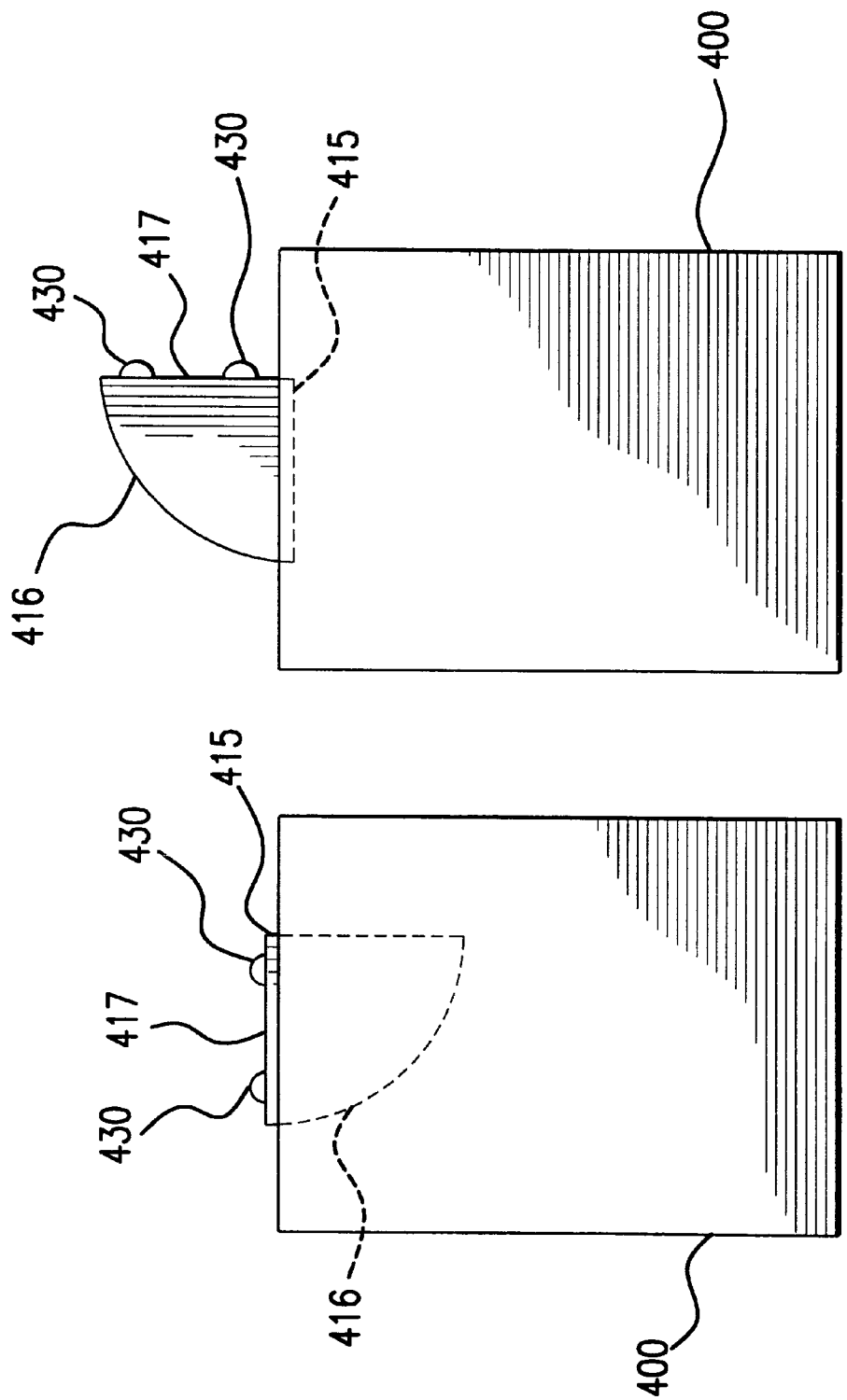

MEMORY CARD ASSEMBLY HAVING AN INTEGRAL ANTENNA

CROSS REFERENCE TO RELATED APPLICATIONS

This application is a continuation-in-part of U.S. patent application Ser. No. 08/855,563, filed May 13, 1997 now U.S. Pat. No. 5,946,194, which is a continuation of U.S. patent application Ser. No. 08/574,931, filed Dec. 19, 1995, now abandoned, which is a continuation of U.S. patent application Ser. No. 08/173,249, filed Dec. 23, 1993, now U.S. Pat. No. 5,519,577. These related applications are herein incorporated by reference.

BACKGROUND OF THE INVENTION

Advancements in electronics technology have allowed electronic equipment, such as computers, to be downsized to facilitate portability. This downsizing has resulted in internal spatial restrictions that have created a need for the establishment of standards for the component devices in the electronic equipment.

The Personal Computer Memory Card International Association (PCMCIA), an organization comprised of hundreds of manufacturers of memory cards and related peripheral equipment, has established spatial standards for all circuit boards used in downsized computers. PCMCIA has developed a 68-pin memory card standard for three memory card types as follows: a. Type I Memory Cards are the same width and length as a common credit card, about 54 mm×85.6 mm, but are thicker than a credit card. The thickness of a Type I card is 3.3 mm (0.130").

b. Type II Memory Cards are used by those companies which are utilizing memory components that are too high to be housed within a Type I card. Type II memory cards are also the same overall length and width as credit cards, but have a raised body cross section in the substrate area which gives them an overall thickness of 5 mm (0.195"). The raised substrate areas of these cards are 48 mm in width.

c. Type III Memory Cards are the result of a recent movement sponsored by the Small Form Factor Committee to enable 1.8" Small Form Factor Disk Drives to be plugged into memory card connectors in small portable computer applications. Type III memory cards are the same length and width as Type I and Type II memory cards. However, Type III cards have a substrate area thickness of 10.5 mm. Also, Type III memory cards require a card guide opening width of 51 mm on the header connector to accommodate the slightly wider raised substrate area.

By complying with the standards established by PCMCIA for memory cards, card manufacturers of peripheral devices, such as communication cards, have assured themselves of compatibility and spatial conformity with computers and other electronic devices that conform to the new PCMCIA standards. The size and shape of the circuit board holder of the present invention comply with the PCMCIA Type II memory card standards. The standard 68-pin connector is plugged into a keyed plug connector on a computer or electronic device and the dimensions of the card holder frame and covers are standard for Type II cards. However, the radio circuit board design and antenna assembly of the present invention are not limited to PCMCIA Type II memory cards and can be used for any memory card, as well as other circuit boards for computers or electronic devices using a variety of edge connectors.

Bar code scanners are widely used at check-out counters in supermarkets, department stores and almost every other business where a cash register is employed. The scanners are typically mounted in either a stationary housing or a hand held "gun" or "wand" that is connected to the computerized register with an electrical cord. A major limitation with these scanners is that they are tethered to the register and cannot be used outside of a short distance from a relatively fixed location. This limitation has created a long felt need in the bar code industry for portable bar code scanners. The present invention meets this need by providing a radio memory card and antenna assembly for a portable bar code scanner that interfaces with a cash register or other computerized device by radio communication. U.S. Pat. No. 5,519,577 to Dudas et al. discloses a radio memory card in a shielded PCMCIA card and is incorporated herein by reference.

The present invention provides for a memory card holder with a circuit board for a spread spectrum radio communicator and an antenna assembly that overcomes Radio Frequency Interference (RFI) shielding, Electrostatic Discharge (ESD) resistance and heat-sinking problems encountered by typical prior art devices. However, this memory card holder is not limited to spread spectrum communicators and may be used for various types of memory cards and circuit boards.

The present invention is specifically designed to provide radio communication between portable bar-code scanners and other data collecting and/or generating devices through a localarea network to a computer. This satisfies a long felt need for communications between a portable scanner and other similar devices and a stationary computer. Such time consuming tasks as taking inventory in a warehouse or other facility are made simpler, easier and faster by the present invention. The present invention, when used with a local-area network installed within the facility, enables a scanner or other device to communicate directly with the computer that manages the inventory. Other uses include monitoring articles as they enter and leave an area and tracking manufacturing production by monitoring articles at various stages of the production process.

In the prior art, communication was typically accomplished by hardwired interconnection between a remote device and a computer or by connecting an external radio communicator to the portable device for communication with the computer. Integrally mounting a radio communicator in a portable device required elaborate shielding methods since the proximity of other electronic components in the spatially restricted housings resulted in the disruption of the radio communication signal. In addition to the digital noise generated from within the housing, these radio communicators also were susceptible to disruption from external noise. These problems were not successfully overcome by typical prior art communicators because the spatial restrictions did not permit adequate room for shielding and grounding.

Wireless devices employ antennas to radiate and receive electromagnetic energy. Antennas generally work best when they are not surrounded by materials that block the radio signals. Therefore, antennas are often designed to extend out of a mobile device or the mobile device is made larger to accommodate a space around the antenna. However, antennas protruding from mobile devices are inconvenient for the user since they generally extend the dimensions of the mobile device and can be easily damaged. The disadvantage of a removable antenna is that the antenna has to be stored and it can be easily misplaced or lost when not connected to the mobile device. Therefore, it is an advantage to be able to store the antenna inside the memory card assembly. This eliminates the problems of the antenna being damaged when the device is not being used and being misplaced or lost when the mobile device is stored.

In most cases, when a user removes or retracts an antenna, the user is no longer using the wireless device since the range is reduced dramatically without the antenna. The present invention controls the power usage of a mobile device by providing a means for the user to power off the wireless device when the antenna is removed.

SUMMARY OF THE INVENTION

The present invention provides a method for producing a radio card assembly that is grounded and shielded from digital noise inside the card holder and from both digital and radio noise outside the card holder. More specifically, the present radio card has shielded compartments on the outer surfaces that isolate electronic components. The present invention also provides an antenna assembly that includes dual function connectors for connecting the antennas and status indicating devices housed in the antenna assembly.

The present invention is for a memory card assembly that includes: 1) a multi-layer memory card circuit board made up of a ground plane disposed between a plurality of planes that include analog and digital circuits, wherein the circuit board has a first outer surface and a second outer surface, a first connector end and a second end, and the first and second outer surfaces are populated with analog and digital components extending upwardly from the surfaces; 2) forming a plurality of electrically shielded compartments on the first and second outer surfaces; 3) at least one dual function connector on the second end, wherein two signals pass through the dual function connector concurrently; 4) an antenna assembly on the second end; and 5) a pair of cover plates on opposing sides of the circuit board, wherein the cover plates form a housing for the circuit board.

The electrically shielded compartments are made up of ground traces and a plurality of shielded housings extending upwardly from the first and second outer surfaces. These compartments electronically isolate the electronic components contained therein from the other components on the surface of the circuit board. In a preferred embodiment, the circuit planes contain separate isolated sections dedicated to either analog or digital circuits.

The second end of the memory card assembly has a first dual function connector and a second dual function connector. Each of the dual function connectors can be used to concurrently pass an analog and a digital signal. In a preferred embodiment, the analog signals are radio signals.

The antenna assembly includes one or more antenna elements and in a preferred embodiment includes a first antenna element and a second antenna element. The antenna elements are housed in a housing that protects the antenna elements from dirt and damage but permits the radio signals to pass through without interruption. The first antenna is connected to the first connector and the second antenna is connected to the second connector. The antenna assembly also includes at least one status indicating device, such as a light emitting diode (LED). In a preferred embodiment, a first indicating device and a second indicating device are provided and the digital signals passing through the dual function connectors actuate the status indicating devices.

In another embodiment of the present invention, the antenna assembly is retractable and has a retracted position, wherein the antenna assembly is substantially inside the housing and an extended position wherein the antenna assembly is substantially outside the housing. In the extended position, the antenna assembly can be rotated up to 90 degrees. The retractable antenna assembly can include a spring for extending the antenna assembly or the antenna assembly can be pivotably retractable. The antenna assembly can include a latching means for securing the antenna assembly in the retracted position and a latching means for securing the antenna assembly in the extended position. In a preferred embodiment, the power to the memory card is interrupted when the antenna assembly is in the retracted position.

When a radio is used in a memory card assembly, the preferred radio communicator is a 915 megahertz or 2.4 gigahertz spread spectrum radio that is well known to those skilled in the art of spread spectrum communication. U.S. Pat. Nos. 5,029,183 and 5,142,550 disclose such communicators and are hereby incorporated by reference herein.

The layered PCMCIA circuit board has an interior ground plane layer disposed between a plurality of planes that include analog and digital circuits. In one embodiment of the present invention, the analog circuits in the circuit board are used for radio circuits. In another embodiment, analog and digital circuits are contained on the same circuit plane and are isolated by ground traces. The multi-layer circuit board enables the formation of multiple circuits in minimal volume. The circuit planes are separated from each other by dielectric layers having plated holes known as buried or blind vias providing electrical interconnections between the layers. This technology is disclosed in U.S. Pat. No. 5,117, 069 to Higgins and U.S. Pat. No. 5,246,817 to Shipley. As certain specific aspects of this technology is used herein, it is hereby incorporated by reference.

In conjunction with the ground plane, the present invention uses a plurality of plated through vias to connect the ground plane with a perimeter trace that extends along three edges of the top surface plane and along all four edges of the bottom surface plane of the circuit board. The perimeter trace provides a shield from stray electrical signals.

The individual planes of the circuit board that form the layers have a thickness of from about 2 mils to about 10 mils, with a preferred thickness of from about 3 mils to about 5 mils. The overall thickness of the layered structure that forms the circuit board is from about 10 mils to about 200 mils, with a preferred thickness of from about 20 mils to about 50 mils. The most preferred thickness for the circuit board in the present invention is about 31 mils. The planes of the layers are made separately and then laminated together to form the circuit board. This technique is well known to those skilled in the art of multi-layer circuit boards.

The present invention provides a radio card assembly that shields the circuit board from external noise, including both radio frequency noise and digital noise. This is accomplished by constructing the covers of the assembly of conductive materials and using electrically conductive glue to seal the covers together. The covers can also be welded together using ultrasonic welding techniques. Together with the ground plane, this effectively creates two shielded compartments inside the card holder. The standard PCMCIA Type II covers have a raised portion of the covers to provide increased internal space. The dimensions of this raised portion of the cover are specified in the PCMCIA standard.

The radio card assembly is also provided with internal shielding and grounding. The circuit board is constructed in a layered configuration with a ground plane disposed between a plurality of circuit planes containing radio and digital circuits. The ground plane shields the signals on one side of the ground plane from signals on the other side. The only openings in the ground plane are through vias for signals passed between the opposing sides of the ground plane. These through vias are appropriately filtered by methods known to those skilled in the art to prevent digital noise from disrupting the radio circuits. The ground plane extends to all of the edges of the circuit board and connects to the conductive traces on both outer surfaces of the circuit board. The traces are located on the perimeter of each surface of the circuit board and are connected to the ground plane by a plurality of through vias. When the circuit board is enclosed by the cover plates, two electrically shielded compartment separated by the ground plane are formed.

Other features and advantages of the present invention will be apparent from the accompanying drawings and from the detailed description that follow below.

DESCRIPTION OF THE DRAWINGS

In the drawings:

FIG. 10a is a plan view of memory card assembly having a spring retractable antenna assembly in the closed position.

FIG. 10b is a plan view of memory card assembly having a spring retractable antenna assembly in the open position.

FIG. 11a is a plan view of memory card assembly having a retractable antenna assembly having a telescoping housing in the closed position.

FIG. 11b is a plan view of memory card assembly having a retractable antenna assembly having a telescoping housing in the open position.

FIG. 12a is a plan view of memory card assembly having a pivotally retractable antenna assembly in the closed position.

FIG. 12b is a plan view of memory card assembly having a pivotally retractable antenna assembly in the open position.

DETAILED DESCRIPTION OF THE INVENTION

As used in this specification, the definitions for the terms listed below are as follows:

PCMCIA Type II memory card—a communication card falling within the parameters of the standards established by the Personal Computer Memory Card International Association for Type II Memory Cards. This standard is hereby incorporated by reference herein.

Radio Frequency Interference (RFI)—any electrical signal capable of being propagated into and interfering with the proper operation of electrical or electronic equipment. The frequency range of such interference may be taken to include the entire electromagnetic spectrum.

Electrostatic Discharge (ESD)—the release of an electric charge stored on the surface of an insulated object to another object having a lower or opposite electrical charge.

Ground plane—a conductor layer, or portion of a conductor layer, used as a common reference point for circuit returns or shielding.

Via—a vertical conductor or conductive path forming the interconnection between multilayer hybrid circuit layers.

Bar-code scanner—An optical scanning device designed to read information printed in the form of bars of different size by detection and processing of the varying reflectivity of light in the bar code.

Spread spectrum transmission—a communication technique in which many different signal wave forms are transmitted in a wide band. Power is spread thinly over the band so narrow-band radios can operate within the wide band without interference.

Local-area network (LAN)—a data-communications system that allows similar or dissimilar digital devices to talk to each other over a common transmission medium. A local network provides such communications over a limited geographical area; distances can vary from a few hundred feet to several miles.

Edge connector—a one piece receptacle, containing female contacts, designed to interconnect and receive the edge of a printed-circuit board on which the male contacts are etched or printed.

Figure 1:
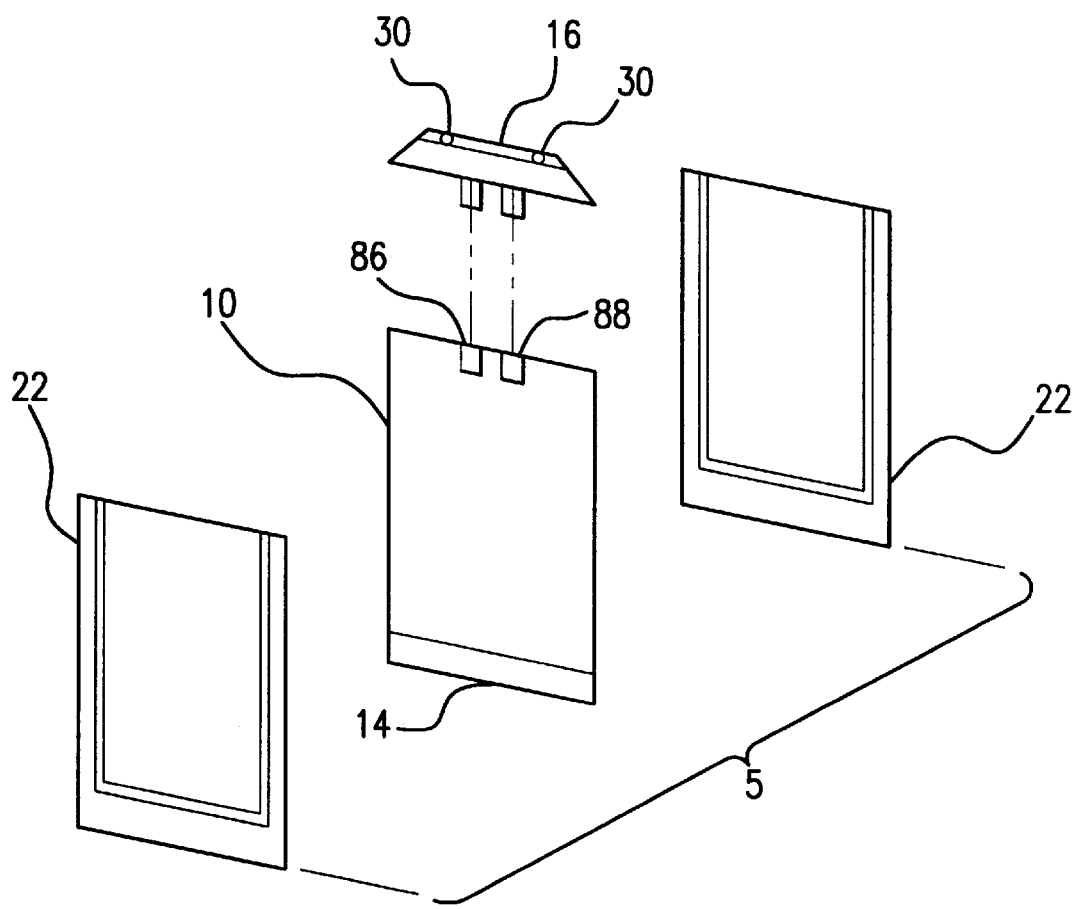
FIG. 1 is an exploded view of the memory card assembly showing the cover plates, the circuit board and antenna assembly.

The PCMCIA Type II memory card holder ("the card holder") of the present invention is designed to be inserted in a standard 68-pin PCMCIA Type II memory card plug. The PCMCIA standards are hereby incorporated by reference herein. Referring first to FIG. 1, the card holder assembly 5 includes a rectangular memory card 10 that has a PCMCIA 68-pin connector 14 on one end. However, this does not preclude the use of another suitable edge connector with the memory card holder. On the end opposing the connector 14, dual function connectors 86 and 88 are provided for mounting an antenna assembly 16 that is capable of housing one or more antennas. The card holder assembly 5 is formed by sandwiching the memory card circuit board 10 between a pair of cover plates 22. The cover plates 22 are fastened together using ultrasonic welding or by an electrically conductive adhesive, preferably a glue, applied along the perimeter on the inside of the cover plates. The cover plates 22 are constructed of an electrically and heat conductive material, preferably stainless steel.

Figure 2B:
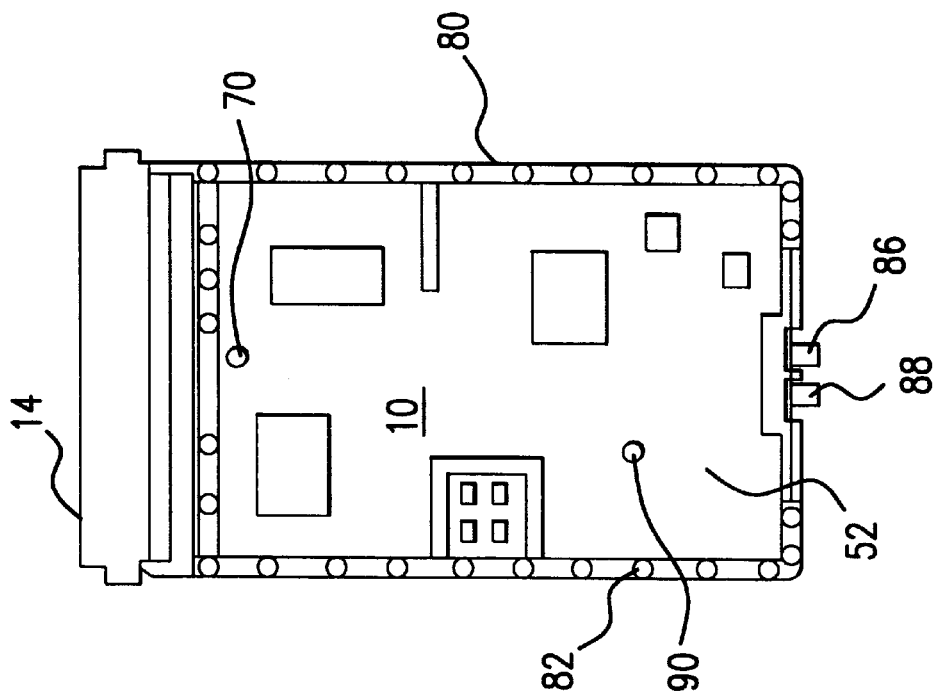
FIG. 2b a plan view of the bottom surface of the circuit board.
Figure 2A:
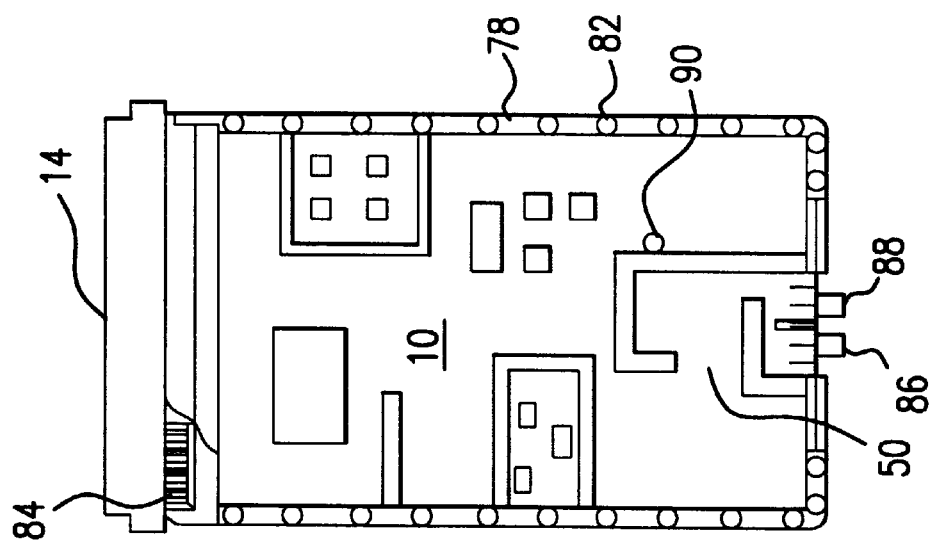
FIG. 2a a plan view of the top surface of the circuit board.

FIGS. 2a and 2b depict the circuit board. The 68-pin connector 14 mounts on one end of the board using well known edge connector methods. The opposing end of the circuit board 10 has connectors 86 and 88 for connecting up to two radio antennas 16. Variations of the design can be used for circuit boards having different functions and different circuit layer configurations.

Figure 3:
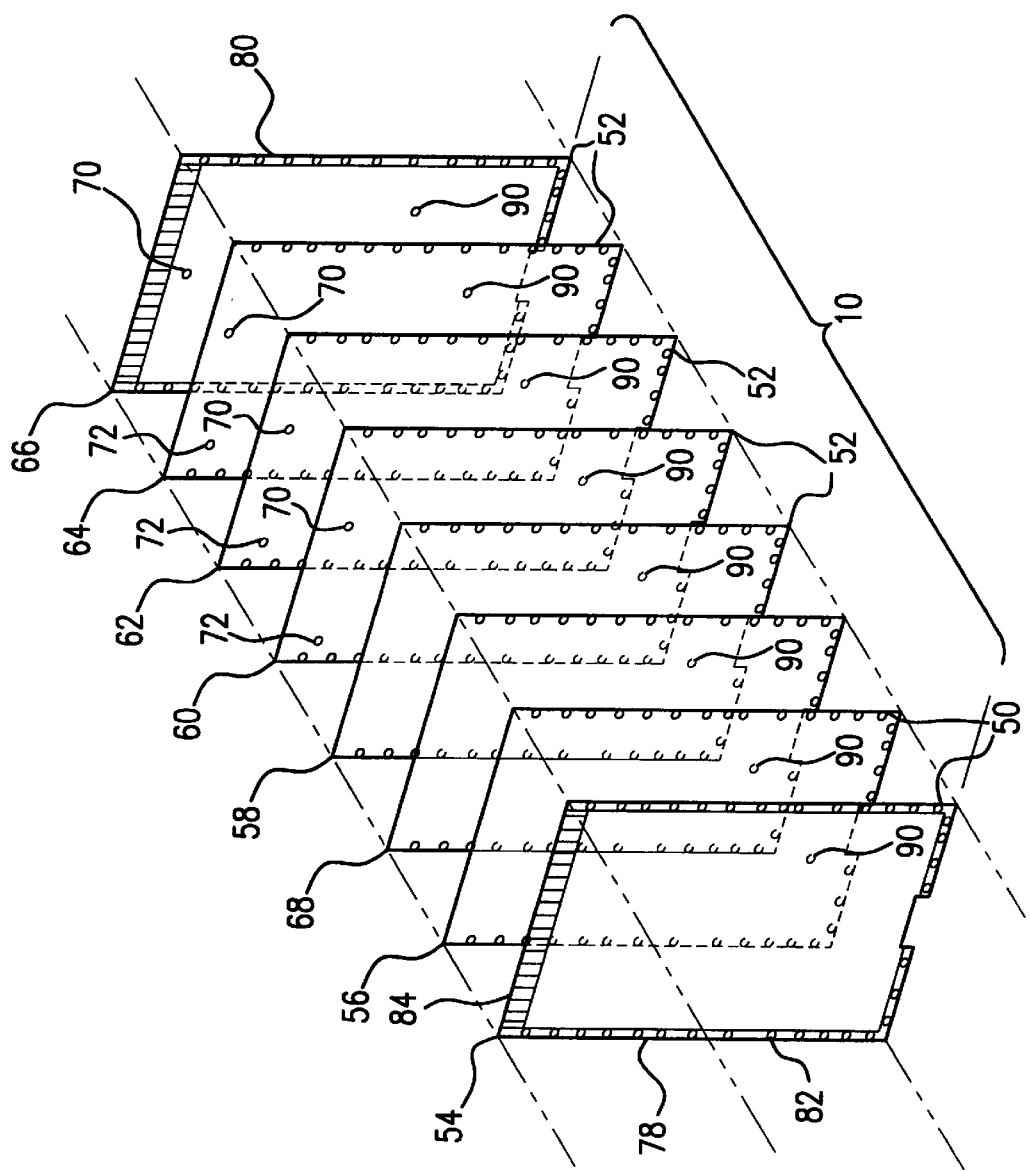
FIG. 3 is an exploded view of the circuit board depicting the multi-layer construction and vias.

The circuit board 10 shown in FIG. 3 has a ground plane 68 disposed between a plurality of circuit planes. The circuit planes 54 and 56 located on one side of the ground plane 68 are electrically shielded by the ground plane 68, and by appropriately filtered vias 90 through which signals pass, from the circuit planes 58, 60, 62, 64 and 66 on the other side.

The locations of vias are determined when the multi-layer circuit board is designed and the interconnections between the layers of circuit planes are established. Vias are made by drilling a hole in a circuit plane and plating the sides of the hole with a conductive metal. A via connects adjacent planes having corresponding holes in the same location. There are three specific types of vias. The type of via used depends on the location of the circuit planes that are being interconnected. A through via goes from one surface of the circuit board to the other surface. A plurality of through vias 82 (typical) are used in the present invention to connect the ground trace 78 on one surface 50 of the circuit board 10 and the ground trace 80 on the opposing surface of the circuit board 10 with the ground plane 68. Blind vias 70 typically connect one of the surface planes 66 with an interior plane or planes 60, 62, and 64 and stop within the circuit board 10 before passing through to the opposing surface plane. Buried vias 72 connect interior planes 60, 62, and 64 and do not penetrate either of the surface planes 54 and 66.

Electrical shielding is maintained by using blind 70 and buried 72 vias for signals passing between the planes on only one side of the ground plane 68. The sole exception to this is a connection for signals that pass through the ground plane. These signals are transmitted in appropriately filtered through vias 90 that insure the minimal leakage of digital noise. These filtered through vias are important in order to reduce the digital noise so that it does not effect the radio circuits.

The ground plane 68 extends to all edges of the circuit board 10 and is connected to perimeter ground traces 78 and 80 on the top and bottom surfaces of the circuit board 10. The ground traces 78 and 80 are composed of an electrically conductive metal. Such metals are well known to those skilled in the art. The ground traces 78 and 80 can be either etched, printed or soldered to the circuit board 10 by means well known in the art.

The connector for the memory card 10 is designed for insertion in a standard PCMCIA memory card plug and it therefore, conforms to the PCMCIA standards for such connectors. However, other edge connectors that are compatible with memory cards can be used. When the card holder is inserted in the plug, the card grounds to the chassis of the host computer or electronic device to provide a ground path. This same ground path is used to discharge any electrostatic charges that build up inside the card holder or are discharged to the card holder assembly 5 from external devices.

When the electrically conductive card holder contacts the chassis of the host computer or electronic device, a ground connection between the card holder assembly 5 and the chassis is formed. This provides a common ground for the circuit board 10 and the other electronic devices in the host chassis and avoids any signal disturbances caused by separate grounds.

Wireless devices now being used in PCMCIA enclosures require an external antenna, or have an attached antenna that extends beyond the depth of a standard PCMCIA card slot, to perform the functions of transmission and reception. The elementary function of establishing a link to a host requires an antenna of some type. In mobile devices, the antennas used with the radio card are often removable so that the user can store the mobile device without fear of damaging the antenna when the mobile is out of range or when the mobile device is being stored. Retractable telescoping antennas which can be retracted into phones are well known and have been widely used in prior art devices. However, the traditional telescoping wire (monopole or dipole) antennas used in phones cannot be easily adapted for use with a radio card. The antenna assembly of the present invention provides an antenna that fits within a standard PCMCIA card format when stowed, and extends to a position of optimum performance outside the PCMCIA card format for wireless transmission/reception.

The antenna assembly of the present invention can include one or more antennas for radio communication, one or more visual indicators, such as light emitting diodes (LEDs), for indicating the status of the radio card and a light weight housing made of electromagnetically transparent material, such as plastic. FIG. 1 shows an embodiment of the present invention in which the antenna assembly 16 is attached to the end of the memory card assembly 5. The two antennas in the antenna assembly 16 are connected to the radio card 10 by two dual function connectors 86 and 88. Each of these connectors 86 and 88 can concurrently be used to connect an antenna and a status indicating device, typically an LED 30. The connectors 86 and 88 also serve the function of mechanically securing the antenna assembly 16 to the radio card assembly 5.

The indicator lights provide the user with a visual indication of the wireless devices operation. The indicator lights can have several colors and/or flashing codes for indicating such things as linked, transmit, power and receive, as well as other status and function indications. In the preferred embodiment, the indicator lights are integral to the antenna assembly. Thus, when the antenna is in the stowed position, the indicator lights are also stowed and, therefore, protected from damage during travel. In the extended position, the indicator lights are fully exposed and visible to the user.

When the housing contains more than one antenna, the housing can be divided into separate compartments for each antenna. The compartments can be formed by dividing the housing with walls parallel to the top and bottom surfaces of the housing or they can be formed by partitioning the housing with internal walls that are parallel to the sides of the housing. The exterior walls of the housing are made of materials that are transparent to the radio signals, while the interior walls of the housing that form the separate compartments can be made of either materials that are transparent to radio signals or materials that the radio signals cannot penetrate, in order to isolate the individual antennas.

The antenna assembly can be mounted on the outside of the memory card assembly or it can be retractable. Different types of antenna can be used in the present invention, including, but not limited to, sleeve dipole, inverted F, dipole, patch, ceramic monopole, folded dipole and loop, with sleeve dipole antenna being preferred. In embodiments that include a retractable antenna assembly, planar antenna are preferred. The antenna are mounted in a retractable antenna assembly and when the radio card is not in use, the antenna can be retracted into the radio card assembly. The retractable antenna assembly is designed to fit between the cover plates of the radio card assembly. The antenna assembly of the present invention provides the advantages of a removable antenna without the disadvantages of previously used removable antenna which have to be stored when not in use.

In one embodiment of the present invention, an eject button is used to unlock the antenna from its stowed position. The eject button can also serve as the lens for one of the indicating lights. When the user presses the eject button, the ejection mechanism unlocks the internal spring catch and the drive spring extends the antenna assembly outside the host device. Once the antenna has fully extended, it is in the second position of operation.

In another embodiment, the ejection mechanism is incorporated in the antenna assembly, so that when the antenna is pressed, the mechanism is released to extend the antenna to the second position of operation.

From the extended position, the antenna is returned to the stowed position by pressing the antenna back into the PCMCIA card. In one embodiment, the operation of the ejection mechanism is audibly indicated by a device that clicks when the antenna assembly is extended to the operating position and when it is retracted into the stowed position.

The antenna assembly of the present invention is attached to the memory card assembly and has at least two mechanical positions of operation. In the first position of operation, the antenna assembly is inside the memory card assembly. This is referred to as the stowed position. In the stowed position, the card and antenna assembly conform to the size requirements of the card standard. When used in a device, such as a Lap Top computer, the antenna and card are contained within the card slot. The stowed position is the traveling position for the antenna assembly and wireless device, as nothing is exposed beyond the exterior of the host device. In the stowed position, the range and sensitivity of the antenna is decreased, so that the antenna and wireless device function with a reduced range and lower throughput.

In the second position of operation, the antenna assembly extends outside the card assembly and beyond the entry of the card slot of the host device. In the extended position, the antenna is exposed to the environment and signals to and from the antenna are not obstructed by the host device. The extended position offers increased throughput and sensitivity.

In a preferred embodiment, the antenna assembly has a third position of operation, wherein the antenna is flipped up, that is rotated 90 degrees from the plane of the card. For routine operation, the rotated position places the antenna upright and perpendicular to the plane of the host device. This position offers the maximum range of throughput for the antenna, although the antenna can also operate effectively when it is rotated less than 90 degrees. The antenna is rotated up or down as required, and as space permits.

Figure 4:
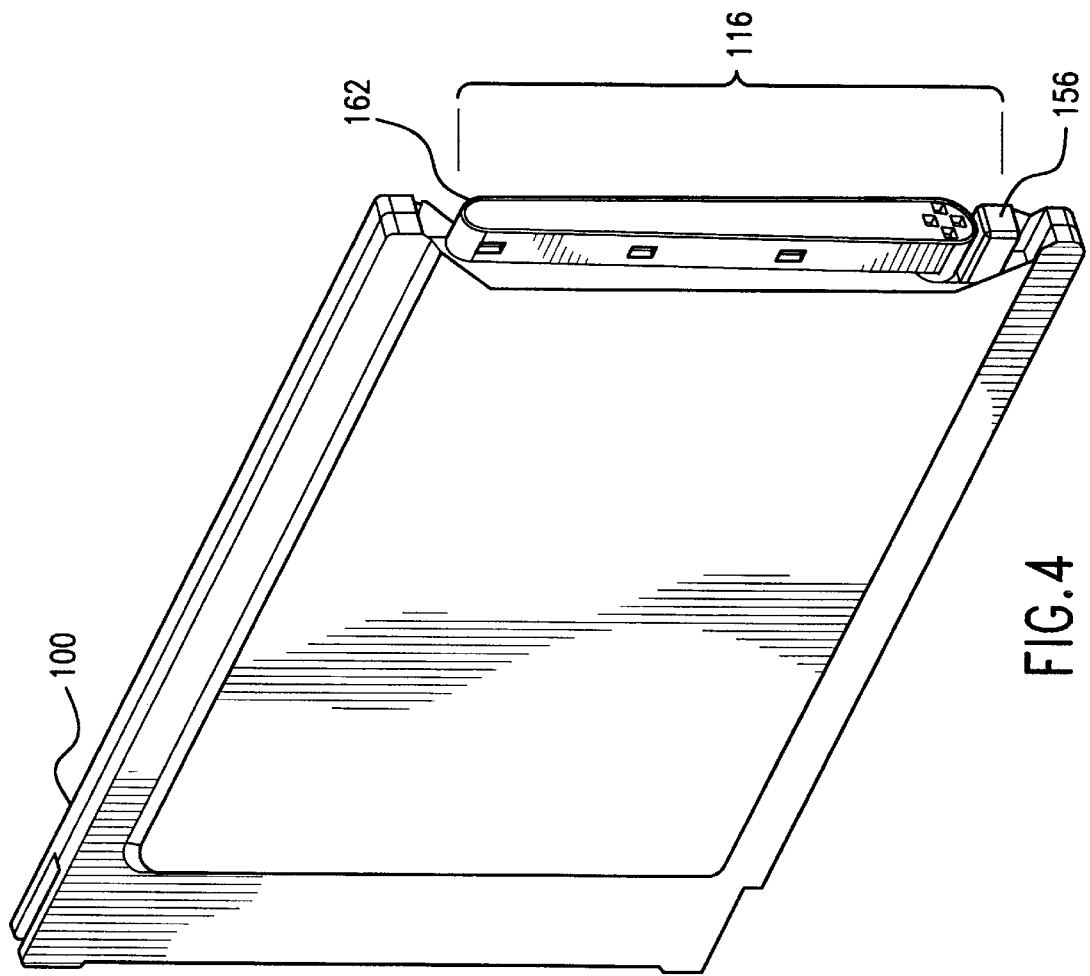
FIG. 4 shows the memory card assembly and retractable and rotatable antenna assembly in the retracted position.
Figure 5:
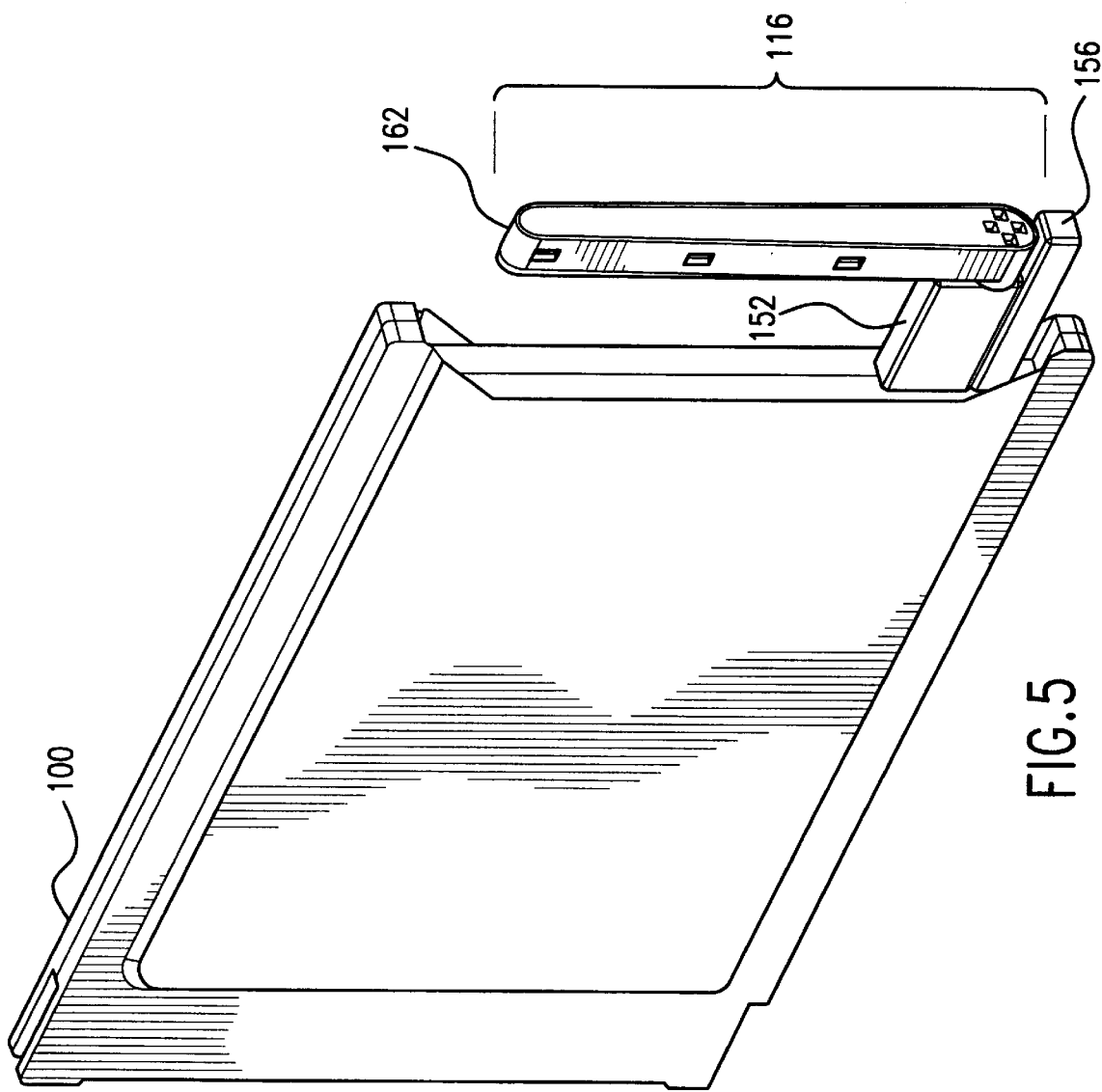
FIG. 5 shows the memory card assembly and retractable and rotatable antenna assembly in the extended position.
Figure 6:
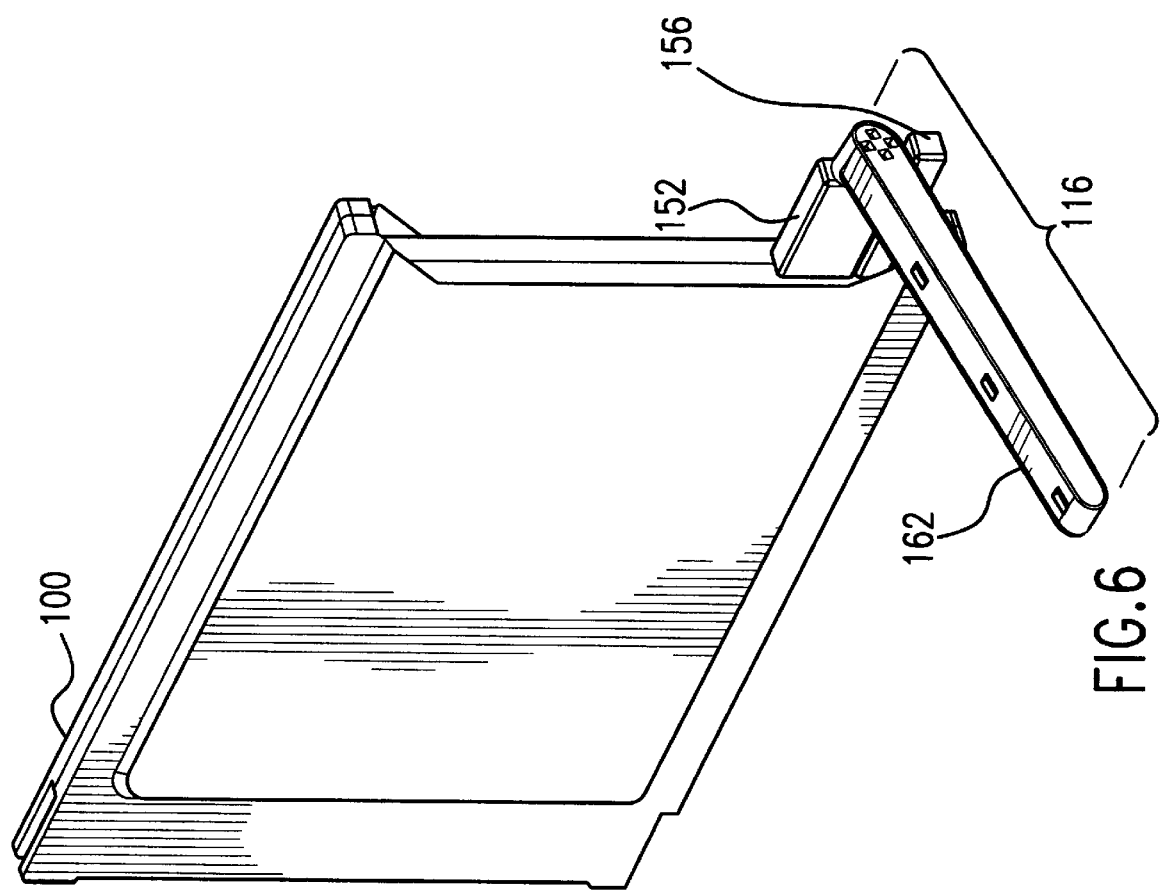
FIG. 6 shows the memory card assembly and retractable and rotatable antenna assembly in the extended and rotated position.
Figure 7:
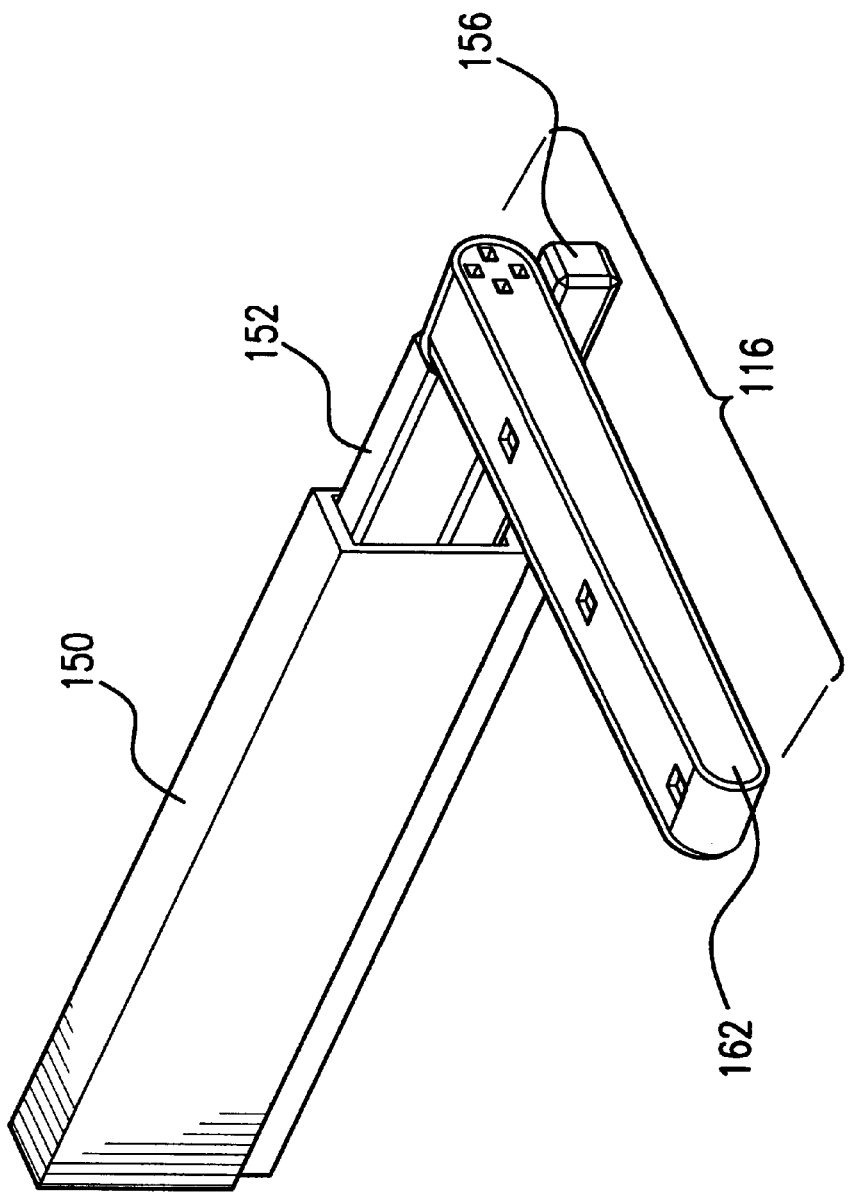
FIG. 7 shows the antenna assembly with the mounting housing and the shuttle assembly.
Figure 8:
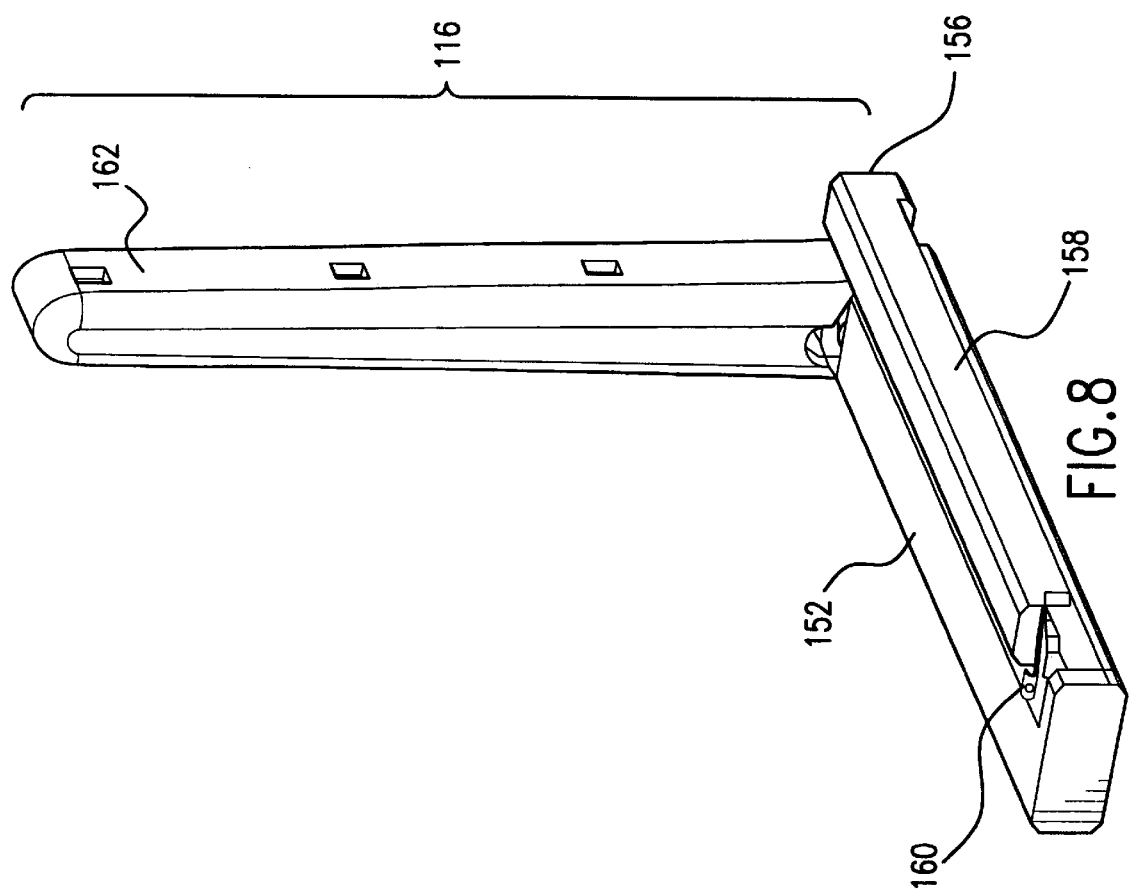
FIG. 8 shows the antenna assembly with the shuttle assembly.
Figure 9:
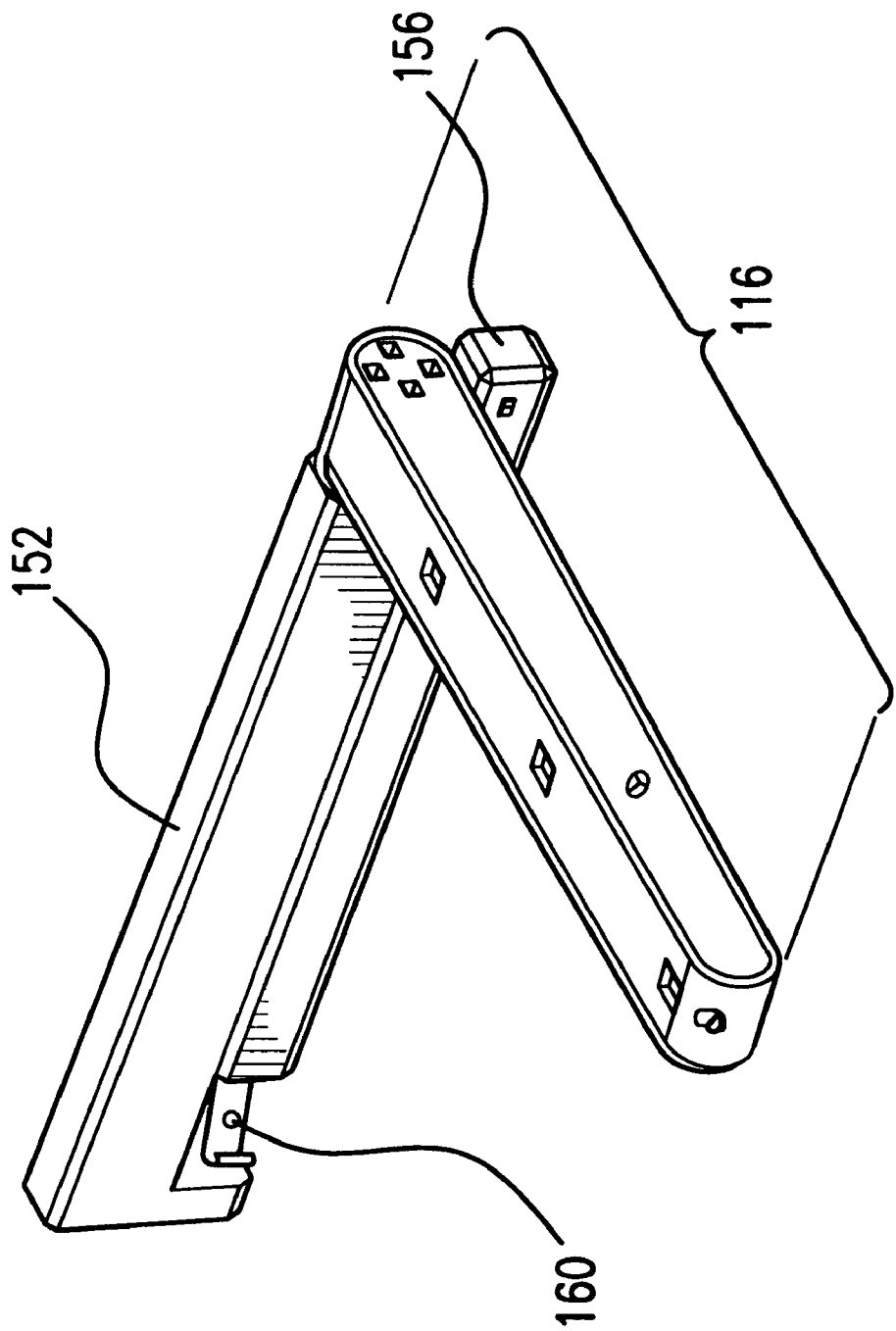
FIG. 9 shows another view of the antenna assembly with the shuttle assembly.

The retractable antenna assembly of the present invention can be extended from the radio card assembly and retracted back into the assembly using several different methods. FIGS. 4 to 6 show a method of mounting the antenna assembly 116 in a radio card assembly 100. The assembly 116 slides out of the card assembly 100 when the radio is being used (see FIG. 5) and can be rotated up to 90 degrees (see FIG. 6) for optimum performance. The antenna assembly 116 slides back into the memory card assembly 100 when the radio is not in use (see FIG. 4). In the retracted position, the antenna assembly 116 can still be used and provides good performance.

The antenna assembly 116 includes a mounting housing 150, a shuttle assembly 152, and an antenna hood assembly 162. The mounting housing 150 is mounted within the memory card assembly 100 and is in slidable communication with the shuttle assembly 152 and is acted on by a drive spring 154. The drive spring 154 is a compression spring that provides the force to push the shuttle assembly 152 and the antenna assembly 116 out of the memory card assembly 100 and into the extended position for operation.

The shuttle assembly 152 includes an eject button 156, a reaction spring 158 and an antenna hood 162. In one embodiment, the shuttle assembly 152 includes one or more coax cables that act as the sleeve dipole for the antenna. The reaction spring 158 is a compression spring that returns the eject button 156 to its static position after the eject button 156 has been depressed. The eject button 156 is preferably mounted on the shuttle assembly 152 and it also can contain an indicating light 130. When the shuttle assembly 152 is extended out from the card assembly 100, the eject button 156 extended along with the shuttle assembly 152 so that it is more readily visible.

The mounting housing 150 can include a catch 160 which is a latching means that engages the shuttle assembly 152 when it is returned to the stowed position. In a preferred embodiment, the catch 160 is a leaf spring. When the eject button 156 is pressed, the catch 160 is disengaged from the mounting housing 150, allowing the drive spring 154 to extend the shuttle assembly 152 to the extended operating position. When the shuttle assembly 152 is retracted into the memory card assembly 100 and returned to the stowed position, the catch 160 automatically re-engages the shuttle assembly 152. In another embodiment, a second catch can be used to engage the shuttle assembly 152 in the extended position.

The antenna hood assembly 162 is a plastic housing that encloses the antenna element and protects it from being damaged. The hood assembly 162 pivots on the antenna shaft segment of the shuttle assembly and can be removed to access the antenna. Various types of antenna can be used but the preferred antenna uses a RG178 coax cable with an integrated sleeve dipole.

FIGS. 10a and 10b show another embodiment of the antenna assembly 216 in a radio card assembly 200 in which the assembly 216 slides out of the card assembly 200 when the radio is being used (see FIG. 10b) and slides back into the card assembly when the radio is not in use (see FIG. 10a). The antenna assembly 200 can be provided with a locking mechanism that secures the antenna assembly 216 in either the extended or the retracted position. In another method for mounting the antenna assembly 216, a spring opposed mechanism is used to slide the assembly 216 between the extended and retracted positions. When the antenna assembly 216 is in the retracted position, it is extended by applying a force to the edge 217 of the antenna assembly 216, which releases a latch and allows the spring mechanism to extend the antenna assembly 216 outside of the radio card assembly 200. When the radio card is not being used, the user pushes the antenna assembly 216 back into the card assembly 200 until it is engaged by the latch, which locks the assembly 216 in the retracted position. Two LEDs 230 for indicating the status of the radio are mounted on the edge 217 of the antenna assembly 216.

FIGS. 11a and 11b show another embodiment of the antenna assembly 316, wherein the antenna assembly 316 houses at least one collapsible antenna. The antenna assembly 316 is in the same plane as the card assembly 300 and has a housing that has two ends, two sides and a top surface and a bottom surface that correspond to the card assembly 300. The connector end 319 of the antenna assembly 316 is fixedly mounted inside the card assembly 300 and remains stationary when the antenna assembly 316 is extended. The other end 317 of the antenna assembly 316 extends from the card assembly 300 when the antenna assembly 316 is in the extended position. The sides and top and bottom surfaces of the housing telescope in and out as the antenna assembly 316 is retracted and extended. The antennas inside the antenna assembly 316 are flexible and have a memory so that they can be compressed when the housing telescopes closed and then return to their original shape when the housing is extended. When the antenna assembly 316 is in the extended position, the antennas are in their operating configuration. For an inverted F antenna, the legs extend from the base of the antenna when the antenna is in the operating configuration. When the antenna assembly 316 is retracted into the card assembly 300, the antennas collapse as the housing telescopes into the card assembly 300. This minimizes the amount of space needed to store the antenna assembly 316 when the radio card is not being used. In addition to planar antennas, small monopole and dipole antennas for communicating short distances can be mounted in the antenna assembly 316. This method can also employ a spring release mechanism and one or more latching mechanisms (as disclosed above) for extending and retracting the antenna assembly 316 and locking the antenna assembly 316 in position.

FIGS. 12a and 12b show another embodiment of the antenna assembly 416, wherein the antenna assembly 416 is pivotally mounted in the card assembly 400. The antenna assembly 416 is stored inside the card assembly 400 when the radio card is not in use (see FIG. 12a) and is pivotally extended outside the card assembly 400 when the radio card is in use (see FIG. 12b). One comer of the antenna assembly 416 is pivotally connected to the card assembly 400. The user extends the antenna assembly 416 from the card assembly 400 by applying force to the edge 417 of the antenna assembly 416 and pivotally extending the antenna assembly 416 outside the card assembly 400. The antenna assembly 416 can have rounded edges as shown in FIGS. 12a and 12b to facilitate extending and retracting the antenna assembly 416 and to maximize the size of the antenna. In a preferred embodiment, a spring mechanism and a locking mechanism (as described above) can be provided to extend and retract the antenna assembly 416 and lock the antenna assembly 416 in the extended and retracted positions.

Mobile devices frequently use batteries as a power source. These batteries have a relatively low storage capacity and can only be used to power the device for a limited period of time before they have to be recharged or replaced. Therefore, it is important in battery powered mobile devices to manage the power usage in order to maximize the mobile working life of the battery. Many mobile devices and wireless devices provide a feature that automatically reduces power consumption or gives the mobile user the option to control device power to reduce power consumption. Unfortunately, these power conservation features are either complex, inconvenient or not completely effective.

In an embodiment of the present invention, the radio card connected to the mobile device can be configured to conserve power when it is not being used. The radio card can automatically go to a low power sleep mode or an off mode when: 1) the radio card connected to the device is inactive for a preset period of time; 2) a function key on the host device is depressed; 3) the antenna is disconnected; or 4) a retractable antenna is in the retracted position. When the radio card is in the low power sleep mode or off mode, it remains in that mode until the user depresses a function key on the host device, the antenna assembly is reconnected to the radio card or the retractable antenna is extended. The methods used for programming the radio card for configuring the power sleep mode or off mode are well known to those skilled in the art.

The antenna connectors are also used to actuate a plurality of status indicating devices located on the antenna assembly. Preferably, the status indicating devices are light emitting diodes (LEDs) that are connected to the radio card and the internal logic of the host mobile device through the antenna connectors. The LEDs can indicate various conditions of the host mobile device and the radio card, including indication that the radio is communicating with a base station and indication that the radio card is transmitting. When the radio card has two connectors, one is used for a primary antenna and the second is used for an auxiliary antenna. An LED can be connected through each of the two connectors without interfering with the radio communication.

When an antenna connector is used to actuate an LED, the center conductor of the connector is used and a DC signal is passed through a resistor, which limits the current, and an inductor, which has a low resistance to the DC voltage but a very high impedance to high frequency radio signals. The inductor isolates the radio signals from the voltage signal being sent to the LED and prevents the voltage signal from loading the radio signals. This circuit isolates the LED signal and the radio signal and minimizes the amount of radio frequency energy lost through the circuit.

While the invention has been described with reference to specific embodiments, the description is not meant to be construed in a limiting sense. Various modifications of the disclosed embodiments, as well as other embodiments of the invention, will be apparent to persons skilled in the art upon reference to this description. It is therefore, contemplated that the appended claims will cover any such modifications or embodiments as fall within the true scope of the invention.

What we claim is:

1. A memory card assembly comprising:
   a multi-layer memory card circuit board comprising a ground plane disposed between a plurality of planes comprising analog and digital circuits, wherein said circuit board has a first outer surface and a second outer surface, a first connector end and a second end, and wherein said first and second outer surfaces are populated with analog and digital components extending upwardly from said surfaces;
   a plurality of electrically shielded compartments on said first and second outer surfaces;
   at least one dual function connector on said second end, wherein two signals pass through said dual function connector concurrently;
   an antenna assembly on said second end; and
   a pair of cover plates on opposing sides of said circuit board, wherein said cover plates form a housing for said circuit board.

2. The memory card assembly of claim 1, wherein said electrically shielded compartments comprise ground traces.

3. The memory card assembly of claim 2, wherein said electrically shielded compartments further comprise a plurality of shielded housings extending upwardly from said first and second outer surfaces.

4. The memory card assembly of claim 1, wherein said second end comprises a first dual function connector and a second dual function connector.

5. The a memory card assembly of claim 4, wherein an analog and a digital signal pass through said first connector and an analog and a digital signal pass through said second connector.

6. The memory card assembly of claim 5, wherein said analog signals are radio signals.

7. The memory card assembly of claim 6, wherein said antenna assembly comprises a first antenna and a second antenna and wherein said first antenna is connected to said first connector and said second antenna is connected to said second connector.

8. The memory card assembly of claim 5, wherein said antenna assembly further comprises a first indicating device and a second indicating device, and wherein said digital signals actuate said status indicating devices.

9. The memory card assembly of claim 8, wherein said status indicating devices are light emitting diodes.

10. The memory card assembly of claim 1, wherein said antenna assembly further comprises at least one status indicating device.

11. The memory card assembly of claim 1, wherein said antenna assembly is retractable and has a retracted position, wherein said antenna assembly is substantially inside said housing and an extended position wherein said antenna assembly is substantially outside said housing.

12. The memory card assembly of claim 11, wherein said antenna assembly further comprises a spring means for extending said antenna assembly.

13. The memory card assembly of claim 11, wherein said antenna assembly is pivotally retractable.

14. The memory card assembly of claim 11, wherein said antenna assembly further comprises a latching means for securing said antenna assembly in said retracted position or securing said assembly in said extended position.

15. The memory card assembly of claim 11, wherein power to said memory card is interrupted when said antenna assembly is in said retracted position.

16. The memory card assembly of claim 11, wherein said antenna assembly comprises an antenna element, a shaft and an arm, wherein said arm houses said antenna element and is in rotatable communication with said shaft.

17. A memory card assembly comprising:
   a multi-layer memory card circuit board comprising a ground plane disposed between a plurality planes comprising analog and digital circuits, wherein said circuit board has a first outer surface and a second outer surface, a first connector end and a second end, and wherein said first and second outer surfaces are populated with analog and digital components extending upwardly from said surfaces;
   a plurality of electrically shielded compartments on said first and second outer surfaces;
   a first dual function connector and a second dual function connector on said second end, wherein two signals pass through each of said dual function connectors concurrently;
   a retractable antenna assembly comprising a first antenna and a second antenna on said second end; and
   a pair of cover plates on opposing sides of said circuit board, wherein said cover plates form a housing for said circuit board.

18. The memory card assembly of claim 17, wherein said electrically shielded compartments comprise ground traces and a plurality of shielded housings extending upwardly from said first and second outer surfaces.

19. The memory card assembly of claim 17, wherein said retractable antenna assembly further comprises a first status indicating device and a second status indicating device.

20. The memory card assembly of claim 18, wherein said first status indicating device and said second status indicating device are light emitting diodes.

21. The memory card assembly of claim 18, wherein said first antenna and said first status indicating device are connected to said first dual function connector and said second antenna and said second status indicating device are connected to said second dual function connector.

22. A memory card assembly comprising:
   a multi-layer memory card circuit board comprising a ground plane disposed between a plurality planes comprising analog and digital circuits, wherein said circuit board has a first outer surface and a second outer surface, a first connector end and a second end, and wherein said first and second outer surfaces are populated with analog and digital components extending upwardly from said surfaces;
   a plurality of electrically shielded compartments on said first and second outer surfaces, wherein said electrically shielded compartments comprise ground traces and a plurality of shielded housings extending upwardly from said first and second outer surfaces;
   a first dual function connector and a second dual function connector on said second end, wherein two signals pass through each of said dual function connectors concurrently;
   a retractable antenna assembly comprising a first antenna, a second antenna, a first status indicating device and a second status indicating device on said second end, wherein said first antenna and said first status indicating device are connected to said first dual function connector and said second antenna and said second status indicating device are connected to said second dual function connector; and
   a pair of cover plates on opposing sides of said circuit board, wherein said cover plates form a housing for said circuit board;
   wherein said retractable antenna assembly has a retracted position, wherein said antenna assembly is substantially inside said housing and an extended position, wherein said antenna assembly is substantially outside said housing.

23. The memory card assembly of claim 22, wherein said retractable antenna assembly comprises a spring for extending said antenna assembly.

24. The memory card assembly of claim 22, wherein power to said memory card is interrupted when said antenna assembly is in said retracted position.

* * * * *